US012288700B2

(12) United States Patent
Kozumi

(10) Patent No.: US 12,288,700 B2
(45) Date of Patent: Apr. 29, 2025

(54) SEMICONDUCTOR MANUFACTURING APPARATUS AND METHOD OF MANUFACTURING SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Shinsuke Kozumi, Kanazawa Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 322 days.

(21) Appl. No.: 17/903,915

(22) Filed: Sep. 6, 2022

(65) Prior Publication Data

US 2023/0298912 A1 Sep. 21, 2023

(30) Foreign Application Priority Data

Mar. 21, 2022 (JP) .................................. 2022-044780

(51) Int. Cl.
*H01L 21/67* (2006.01)
(52) U.S. Cl.
CPC .............................. *H01L 21/67132* (2013.01)
(58) Field of Classification Search
CPC ............................................... H01L 21/67132

(Continued)

(56) References Cited

U.S. PATENT DOCUMENTS 7,740,728 B2 6/2010 Ametani
11,735,464 B1* 8/2023 Hackler, Sr. ........ H01L 21/6835
438/464

(Continued)

FOREIGN PATENT DOCUMENTS

JP 2001-291762 A 10/2001
JP 2007-036111 A 2/2007

(Continued)

OTHER PUBLICATIONS

Office Action in Japanese Patent Application No. 2022-044780 dated Mar. 11, 2025 in 6 pages.

*Primary Examiner* — James D Sells
(74) *Attorney, Agent, or Firm* — Knobbe, Martens, Olson & Bear, LLP

(57) ABSTRACT

The semiconductor manufacturing apparatus of the embodiment includes a first roller performing a first release of a release tape, the release tape having a strip-like configuration and having a first end and a second end, the release tape pasted on a protective tape pasted on a second substrate surface of a substrate, the substrate having a first substrate surface and the second substrate surface facing the first substrate surface, the second substrate surface being provided above the first substrate surface, and the first roller performing a first movement in a direction parallel to the second substrate surface from on the first end toward above a center or its vicinity of the second substrate surface; and a second roller performing a second release of the release tape, the second roller performing a second movement in a direction parallel to the second substrate surface from on the second end toward above the center or its vicinity of the second substrate surface.

16 Claims, 13 Drawing Sheets

(58) Field of Classification Search
USPC .......................................................... 156/715
See application file for complete search history.

(56) References Cited

U.S. PATENT DOCUMENTS

| | | |
|---|---|---|
| 2009/0095418 A1 | 4/2009 | Yamamoto et al. |
| 2013/0240127 A1 | 9/2013 | Yamashita |

FOREIGN PATENT DOCUMENTS

| | | |
|---|---|---|
| JP | 2007-088136 A | 4/2007 |
| JP | 2009-044008 A | 2/2009 |
| JP | 2009-094355 A | 4/2009 |
| JP | 2011-091180 A | 5/2011 |
| JP | 2011-114270 A | 6/2011 |
| JP | 2013-191745 A | 9/2013 |

* cited by examiner

SEMICONDUCTOR MANUFACTURING APPARATUS AND METHOD OF MANUFACTURING SEMICONDUCTOR DEVICE

CROSS-REFERENCE TO RELATED APPLICATION

This application is based upon and claims the benefit of priority from Japanese Patent Application No. 2022-044780, filed on Mar. 21, 2022, the entire contents of which are incorporated herein by reference.

FIELD

Embodiments described herein relate generally to a semiconductor manufacturing apparatus and a method of manufacturing a semiconductor device.

BACKGROUND

Semiconductor devices such as a MOSFET(Metal Oxide Semiconductor Field Effect Transistor) are used in applications for power conversion.

In manufacturing such a semiconductor device, a protective tape such as a back grind tape (BG tape) is attached to a substrate surface of a wafer (substrate). When the protective tape is released, a release tape is used. Specifically, the release tape is pasted on the protective tape, and the release tape is released, thereby the protective tape is released together with the release tape from the substrate surface.

DETAILED DESCRIPTION

Figure 1A:
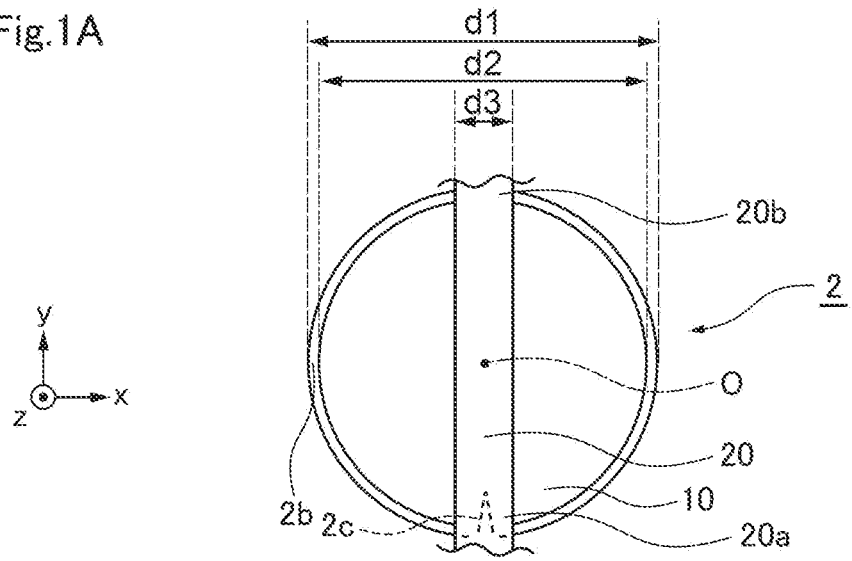
FIGS. 1A-B are schematic diagrams showing a substrate, the protective tape and a release tape of a first embodiment.

Embodiments of the present invention will be described below with reference to the drawings. In the following description, the same members and the like are denoted by the same reference numerals, and the description of the members and the like once described is appropriately omitted.

In this specification, the upper direction of the drawing is referred to as "upper" and the lower direction of the drawing is referred to as "lower" in order to indicate the positional relationship of components and the like. In this specification, the conceptuals "up" and "down" are not necessarily terms indicating a relationship with the direction of gravity.

First Embodiment

The semiconductor manufacturing apparatus of the present embodiment includes a first roller performing a first release of a release tape, the release tape having a strip-like configuration and having a first end and a second end, the release tape pasted on a protective tape pasted on a second substrate surface of a substrate, the substrate having a first substrate surface and the second substrate surface facing the first substrate surface, the second substrate surface being provided above the first substrate surface, and the first roller performing a first movement in a direction parallel to the second substrate surface from on the first end toward above a center or its vicinity of the second substrate surface; and a second roller performing a second release of the release tape, the second roller performing a second movement in a direction parallel to the second substrate surface from on the second end toward above the center or its vicinity of the second substrate surface.

A method of manufacturing a semiconductor device of the present embodiment includes a step of performing a first release of a release tape by a first roller, the release tape having a strip-like configuration and having a first end and a second end, the release tape pasted on a protective tape pasted on a second substrate surface of a substrate, the substrate having a first substrate surface and the second substrate surface facing the first substrate surface, the second substrate surface being provided above the first substrate surface, and the first roller performing a first movement in a direction parallel to the second substrate surface from on the first end toward above a center or its vicinity of the second substrate surface; and a step of performing a second release of the release tape by a second roller, the second roller performing a second movement in a direction parallel to the second substrate surface from on the second end toward above the center or its vicinity of the second substrate surface.

Figure 1B:
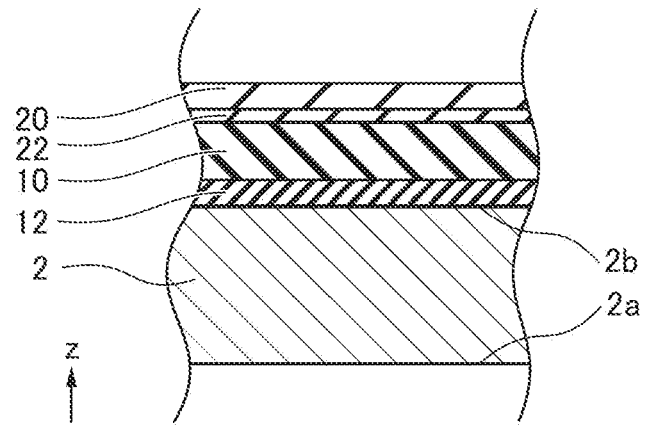

FIGS. 1A-B are schematic diagrams showing the substrate 2, the protective tape 10, and the release tape 20 of the present embodiment. FIG. 1A is a schematic top view of the substrate 2, the protective tape 10, and the release tape 20 of the present embodiment. FIG. 1B is a schematic cross-sectional view of a part of the substrate 2, the protective tape 10, and the release tape 20 of the present embodiment.

The substrate 2 includes a semiconducting material. Here, the semiconductive material is, for example, Si (silicon), SiC (silicon carbide), GaAs (gallium arsenide), or GaN (gallium nitride), but is not limited thereto. The substrate 2 is, for example, a substrate on which semiconductor devices such as the MOSFET (Metal Oxide Semiconductor Field Effect Transistor) or an IGBT (Insulated Gate Bipolar Transistor) are formed. The semiconductor manufacturing apparatus of the present embodiment is used in the step of separating the substrate 2 by dicing or the like, and manufacturing the semiconductor device (semiconductor chip) having the semiconductor device described above.

The substrate 2 has a diameter $d_1$. The substrate 2 has a first substrate surface 2a, and a second substrate surface 2b facing the first substrate surface 2a and provided above the first substrate surface 2a. In FIG. 1A, the center O of the second substrate surface 2b is shown together.

Here, an X-direction, a Y-direction vertically intersecting with the X-direction, and a Z-direction vertically intersecting with the X-direction and the Y-direction are defined. It is assumed that the first substrate surface 2a and the second substrate surface 2b are provided parallel to the XY plane.

The protective tape 10 is provided on the second substrate surface 2b. The protective tape 10 has the first adhesive layer 12. The protective tape 10 is pasted to the second substrate surface 2b by the first adhesive layer 12. When the semiconductor devices such as the MOSFETs, the IGBTs, and the like, are formed on the substrate 2, for on-resistance reduction, reducing the film thickness of the substrate 2 by grinding the first substrate surface 2a and thus reducing the on-resistance are performed. At this time, the protective tape 10 is used to protect the circuit patterns of the MOSFETs, IGBTs, and the like, which are formed on second substrate surface 2b. The protective tape 10 is, for example, a back grind tape. Further, the protective tape 10 is used for protecting the substrate 2 during the flow in the post-process. The semiconductor manufacturing apparatus and the method of manufacturing the semiconductor device of the present embodiment are used for releasing the protective tape 10.

Incidentally, the protective tape 10 may be pasted to the ground substrate surface. For example, the substrate 2 having the first substrate surface 2a on which circuit patterns of the MOSFETs or the IGBTs are formed and the second substrate surface 2b which is ground and thus the film thickness of the substrate 2 is reduced, is considered. In such cases, the protective tape 10 may be attached to the second substrate surface 2b. The semiconductor manufacturing apparatus and the method of manufacturing the semiconductor device of the present embodiment are also preferably used for releasing the protective tape 10 pasted to the second substrate surface 2b which is ground.

Further, the protective tape 10 may be attached to the substrate surface which does not have the circuit patterns of the MOSFETs or the IGBTs and is not ground. For example, the substrate 2 having the first substrate surface 2a on which the circuit patterns of the MOSFETs and the IGBTs are formed, and the second substrate surface 2b which is not ground, is considered. In such cases, the protective tape 10 may be attached to the second substrate surface 2b. The semiconductor manufacturing apparatus and the method of manufacturing the semiconductor device of the present embodiment are also preferably used for releasing the protective tape 10 pasted to second substrate surface 2b which does not have the circuit patterns of the MOSFETs or the IGBTs and is not ground.

Hereinafter, explanation will be given by assuming that the first substrate surface 2a is ground, and the circuit patterns of the MOSFETs and the IGBTs are formed on the second substrate surface 2b.

The semiconductor manufacturing apparatus and the method of manufacturing the semiconductor device of the present embodiment are particularly preferably used when the protective tape 10 has a diameter $d_2$ shorter than the diameter $d_1$ of the substrate.

The release tape 20 is provided on the protective tape 10. The release tape 20 has, for example, a strip-like configuration with a width d: shorter than the diameter $d_1$ of the substrate 2 and shorter than the protective tape 10 diameter $d_2$. Note that the width $d_3$ of the release tape may be longer than the diameter $d_1$ of the substrate 2. The release tape 20 is provided across the second substrate surface 2b. The release tape 20 has a second adhesive layer 22. Then, the release tape 20 is pasted to the protective tape 10 by the second adhesive layer 22. The release tape 20 has a first end 20a and a second end 20b. Note that the release tape 20 may have portions further extended from the first end 20a and the second end 20b, respectively. The release tape 20 is used to release the protective tape 10 from the second substrate surface 2b.

Note that, for example, the protective tape 10 may further has an adhesive layer (not shown) which is adhered to the second adhesive layer 22.

A notch 2c of the substrate 2 is provided, for example, on the lower side of FIG. 1A. However, the notch 2c may be provided, for example, on the upper side of FIG. 1A, on the left side of FIG. 1A, or on the right side of FIG. 1A. Further, the notch 2c may not be provided. Further, instead of the notch 2c, an orientation flat may be provided.

Figure 2:
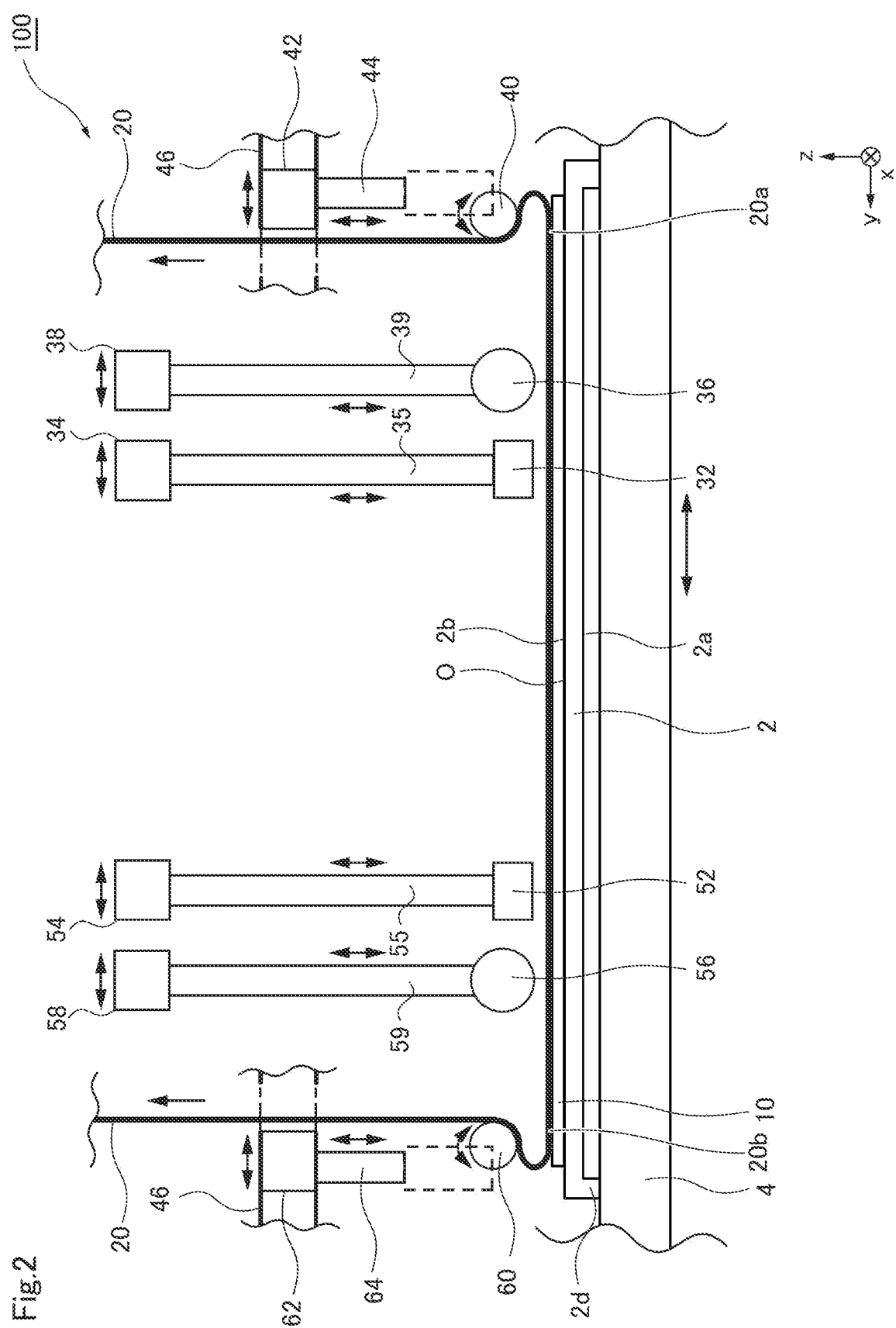
FIG. 2 is a schematic diagram of the semiconductor manufacturing apparatus of the first embodiment.

FIG. 2 is a schematic diagram of the semiconductor manufacturing apparatus 100 of the present embodiment.

Note that the illustrations of the first adhesive layer 12 and the second adhesive layer 22 are omitted.

Here, a case is explained where the protective tape 10, pasted to the second substrate surface 2b of the substrate 2, is released using the release tape 20 and the second substrate surface 2b has been thinned by back-grinding. A convex portion 2d is provided on the first substrate surface 2a for maintaining the strength of the substrate 2 even when the substrate 2 is thinned. Note that the semiconductor manufacturing apparatus 100 of the present embodiment is preferably applicable to the substrate 2 which is not thinned and does not have the convex portion 2d.

A stage 4 is a stage on which the substrate 2 is placed. For example, the stage 4 can be moved in the Y-direction while holding the substrate 2 by a vacuum-adsorption mechanism (not shown) or the like.

Here, the Z direction is, for example, opposite to the vertical direction. The stage 4 holds the first substrate surface 2a and the second substrate surface 2b horizontally.

The first release roller 40 (an example of a first roller) is provided above the substrate 2. The first release roller 40 is a roller for folding back and releasing the release tape 20 when releasing the release tape 20 from the first end 20a. The first release roller 40 is rotatable in the YZ plane. The first release roller 40 is, for example, movable in the vertical direction by a cylinder 44 connected to the first release roller 40. Further, for example, the cylinder 44 is movable above the substrate 2 in the Y direction using a slider 42 provided in a rail 46. Thus, the first release roller 40 is movable above the substrate 2 in the Y-direction. The means for allowing the first release roller 40 to move in the vertical direction and the Y direction is not limited to the above-mentioned means.

A first paste roller 36 is provided above the substrate 2. The first paste roller 36 is for pressing and pasting the release tape 20 on the protective tape 10. Incidentally, the first paste roller 36, for example, is movable in the vertical direction and Y direction by a cylinder 39 connected to the first paste roller 36, and a slider 38 connected to the cylinder 39.

A first heater 32 is provided above the substrate 2. The first heater 32 is provided to more firmly paste the release tape 20 to the protective tape 10 by heating the first end 20*a* of the release tape 20 pasted on the protective tape 10. Further, the first heater 32 is provided to lower the adhesive force of the first adhesive layer 12 by heating the first end 20*a* of the release tape 20 pasted on the protective tape 10. Incidentally, the first heater 32, for example, is movable in the vertical direction and Y direction by a cylinder 35 connected to the first heater 32, and a slider 34 connected to the cylinder 35.

The second release roller 60 (an example of a second roller) is provided above the substrate 2. The second release roller 60 is a roller for folding back and releasing the release tape 20 when releasing the release tape 20 from the second end 20*b*. The second release roller 60 is rotatable in the YZ plane. The second release roller 60, for example, is movable in the vertical direction by a cylinder 64 connected to the second release roller 60. Further, for example, the cylinder 64 is movable above the substrate 2 in the Y direction using a slider 62 provided in the rail 46. Thus, the second release roller 60 is movable above the substrate 2 in the Y-direction. The means for allowing the second release roller 60 to move in the vertical direction and the Y direction is not limited to the above-mentioned means.

The second paste roller 56 is provided above the substrate 2. The second paste roller 56 is for pressing and pasting the release tape 20 onto the protective tape 10. Incidentally, the second paste roller 56, for example, is movable in the vertical direction and Y direction by a cylinder 59 connected to the second paste roller 56, and a slider 58 connected to the cylinder 59.

The second heater 52 is provided above the substrate 2. The second heater 52 is provided to more firmly paste the release tape 20 to the protective tape 10 by heating the second end 20*b* of the release tape 20 pasted on the protective tape 10. Further, the second heater 52 is provided to lower the adhesive force of the first adhesive layer 12 by heating the second end 20*b* of the release tape 20 pasted on the protective tape 10. Incidentally, the second heater 52, for example, is movable in the vertical direction and Y direction by a cylinder 55 connected to the second heater 52, and a slider 54 connected to the cylinder 55.

The release tape 20 and the protective tape 10 released by the first release roller 40 and the second release roller 60 are wound up, by using, for example, winding rollers (not shown).

Figure 3:
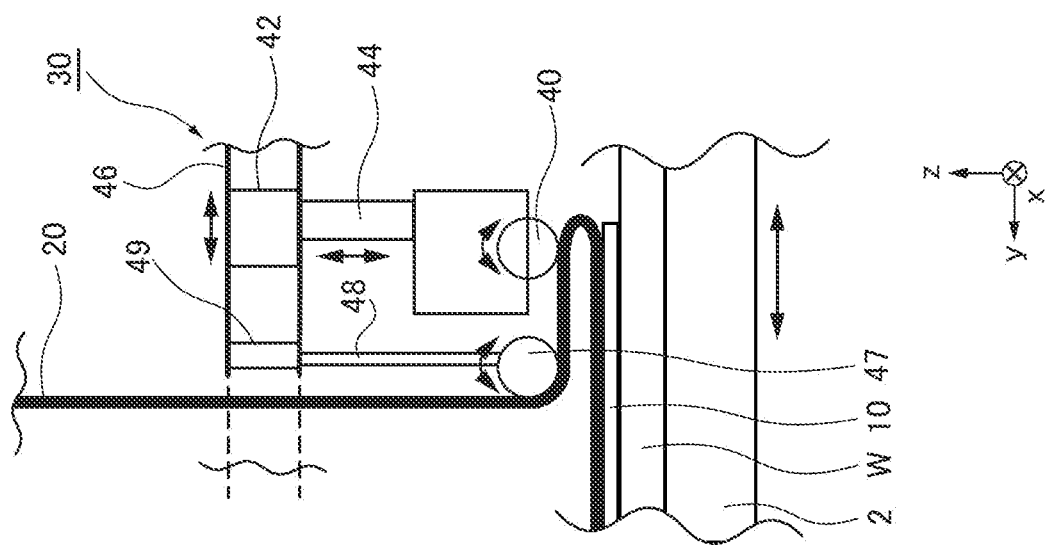
FIG. 3 is a schematic diagram of a main part of the semiconductor manufacturing apparatus according to another aspect of the first embodiment.

FIG. 3 is a schematic diagram of a main part of a semiconductor manufacturing apparatus according to another aspect of the present embodiment. The release tape 20 released by the first release roller 40 may be folded upward by a fold-back roller 47. Incidentally, for example, the fold-back roller 47 is movable in the vertical direction and Y direction by a cylinder 48 connected to the fold-back roller 47 and a slider 49 connected to the cylinder 48. Similarly, the release tape 20 released by the second release roller 60 may be folded upward by a fold-back roller (not shown).

Figure 4:
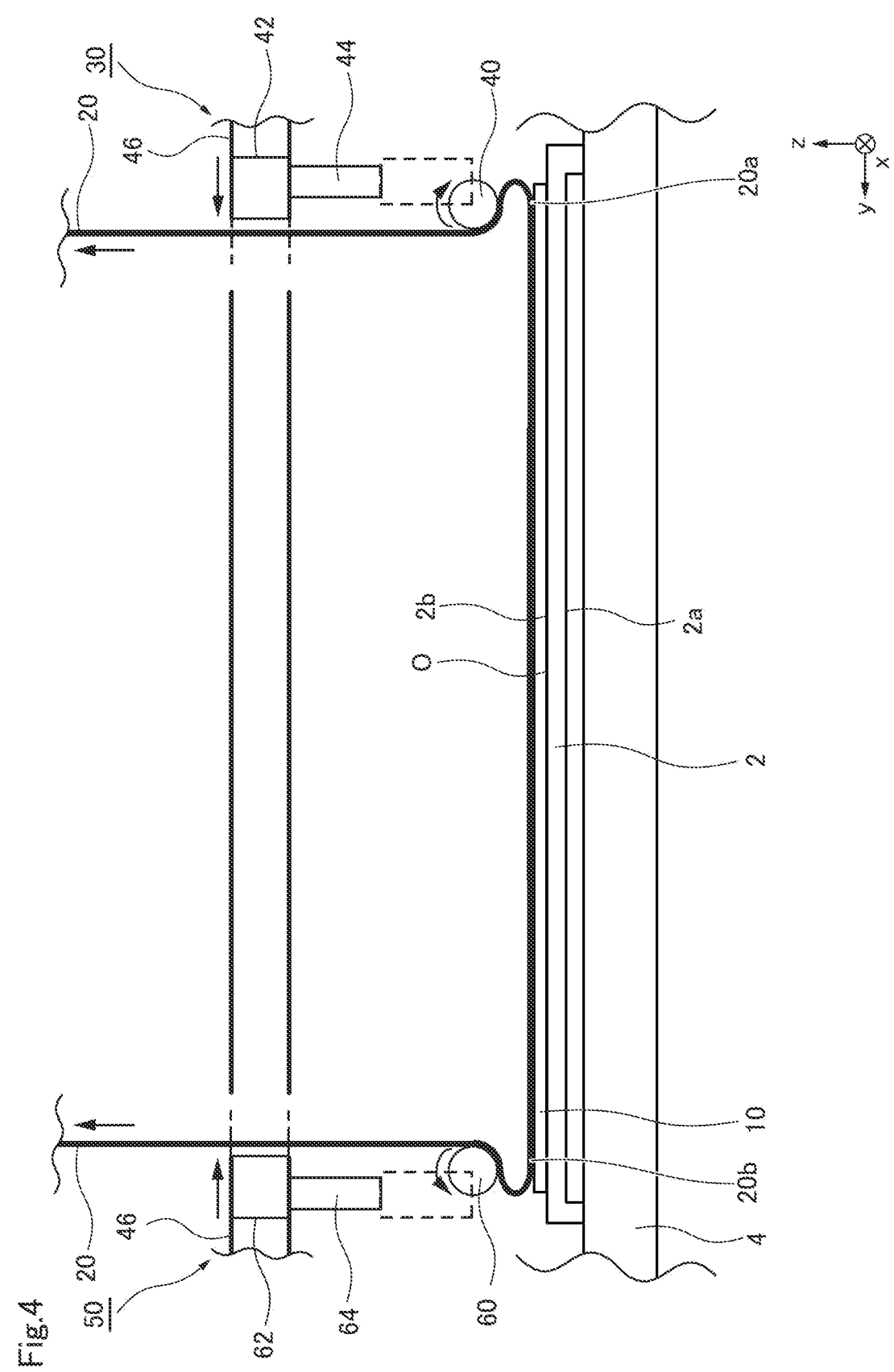
FIG. 4 is a schematic diagram for explaining the method of manufacturing the semiconductor device of the first embodiment.
Figure 5:
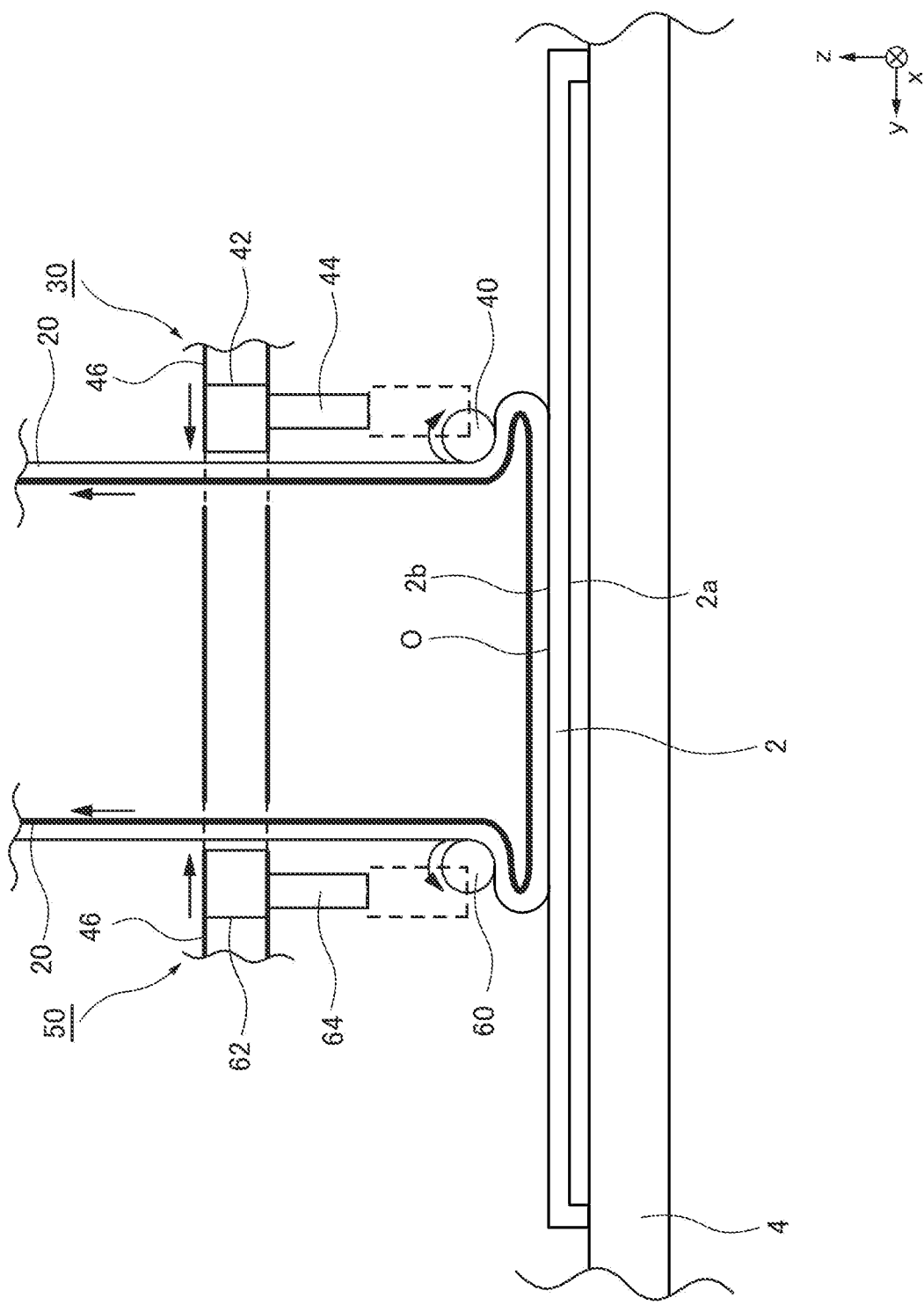
FIG. 5 is a schematic diagram for explaining the method of manufacturing the semiconductor device of the first embodiment.
Figure 6:
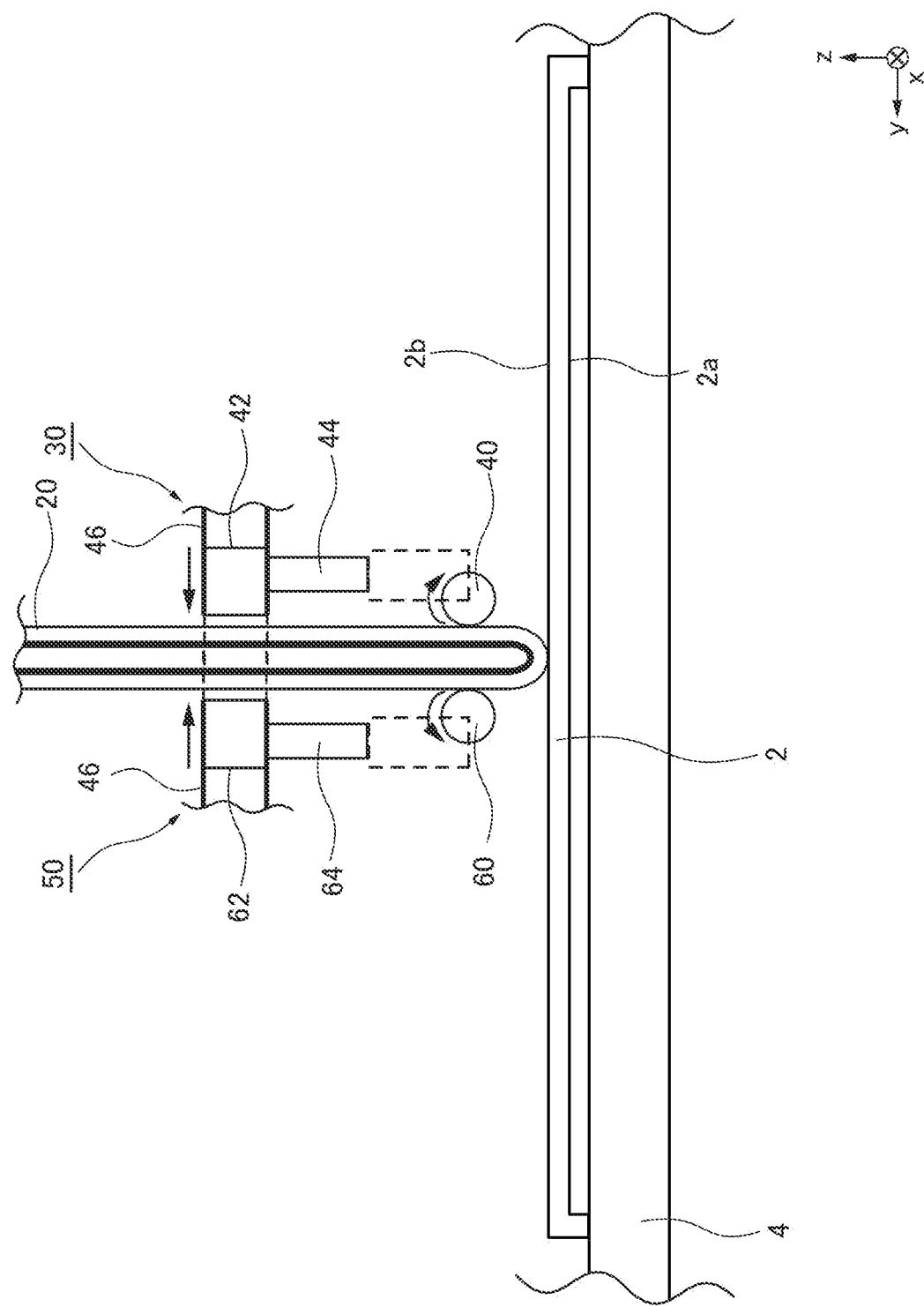
FIG. 6 is a schematic diagram for explaining the method of manufacturing the semiconductor device of the first embodiment.

FIGS. 4 to 6 are schematic diagrams for explaining the method of manufacturing the semiconductor device of the present embodiment. In FIGS. 4 to 6, illustrations of the first heater 32, the slider 34, the cylinder 35, the first paste roller 36, the cylinder 39, the slider 38, the second heater 52, the slider 54, the cylinder 55, the second paste roller 56, the slider 58, and the cylinder 59 are omitted.

First, using the first paste roller 36, the first end 20*a* of the release tape 20 is pressed and pasted on the protective tape 10. Further, using the second paste roller 56, the second end 20*b* of the release tape 20 is pressed and pasted on the protective tape 10. Similarly, the release tape 20 is pasted on the protective tape 10 over the second substrate surface 2*b*.

Next, the first end 20*a* of the release tape 20 is heated using the first heater 32. Further, the second end 20*b* of the release tape 20 is heated using the second heater 52. Similarly, the release tape 20 is heated over the second substrate surface 2*b*.

Next, using the slider 42, a movement tan example of the first movement) of the first release roller 40 is performed in the Y-direction parallel to the second substrate surface 2*b* from on the first end 20*a* toward above the center O or its vicinity of the second substrate surface 2*b*. Thus, the first release of the release tape 20 from the first end 20*a* is performed. Here, it is preferable that the form of the folding back of the release tape 20 by the first release roller 40 is kept as constant as possible. In other words, the movement of the first release roller 40 in the Y-direction is performed so that the shape of the folding back of the release tape 20 by the first release roller 40 is kept as constant as possible.

Further, using the slider 62, a movement (an example of the second movement) of the second release roller 60 is performed in the Y-direction parallel to the second substrate surface 2*b* from on the second end 20*b* toward above the center O or its vicinity of the second substrate surface 2*b*. Thus, the second release of the release tape 20 from the second end 20*b* is performed. Here, it is preferable that the form of the folding back of the release tape 20 by the second release roller 60 is kept as constant as possible. In other words, the movement of the second release roller 60 in the Y-direction is performed so that the shape of the folding back of the release tape 20 by the second release roller 60 is kept as constant as possible. (FIGS. 4 and 5).

In this way, the protective tape 10 is released (FIG. 6).

Here, it is preferable that the step of performing the first release and the step of performing the second release are performed simultaneously. Further, it is preferable that a first distance of the first movement and a second distance of the second movement are equal to each other.

Further, in the absence of slippage or the like between the first release roller 40 and the release tape 20, the first distance of the first movement is equal to a first release amount of the first release of the release tape 20. Further, in the absence of slippage or the like between the second release roller 60 and the release tape 20, the second distance of the second movement is equal to a second release amount of the second release of the release tape 20.

Next, the operation and effect of the semiconductor manufacturing apparatus and the method of manufacturing the semiconductor device of the present embodiment will be described.

There are two possibilities for pasting the protective tape 10 to the substrate 2: pasting the protective tape 10 having a diameter larger than the diameter $d_1$ of the substrate 2, and pasting the protective tape 10 having a diameter smaller than the diameter $d_1$ of the substrate 2. When the protective tape 10 having a diameter larger than the diameter $d_1$ of the substrate 2 is pasted, if the substrate 2 to which the protective tape 10 is pasted is inserted into a substrate cassette or the like, the first adhesive layer 12 of the protective tape 10 protruding from the substrate 2 is pasted to the substrate cassette, and the substrate cassette is contaminated. Further, when substrate 2 is flowed in a later step, the first adhesive layer 12 of the protective tape 10 protruding from the substrate 2 adheres to the other semiconductor manufacturing apparatus, and the other semiconductor manufacturing apparatus is contaminated. Therefore, from the above viewpoint, it is preferable to paste the protective tape 10 having a diameter smaller than the diameter $d_1$ of the substrate 2.

Figure 7A:
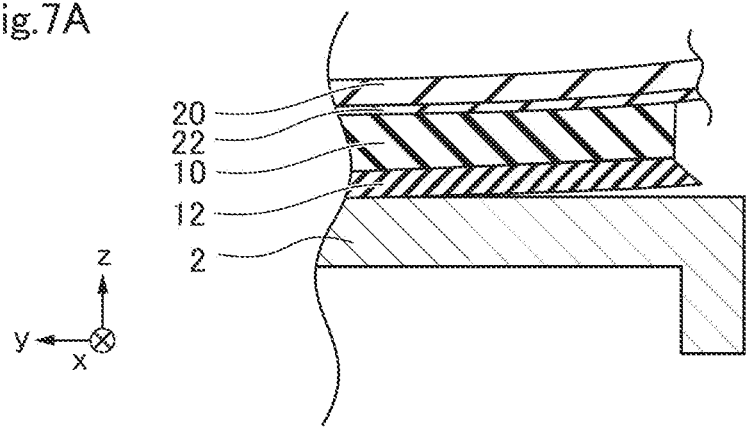
FIGS. 7A-B are schematic cross-sectional views for explaining stresses applied to a first adhesive layer when the protective tape is released using the release tape in the semiconductor manufacturing apparatus of the comparative embodiment of the first embodiment.
Figure 7B:
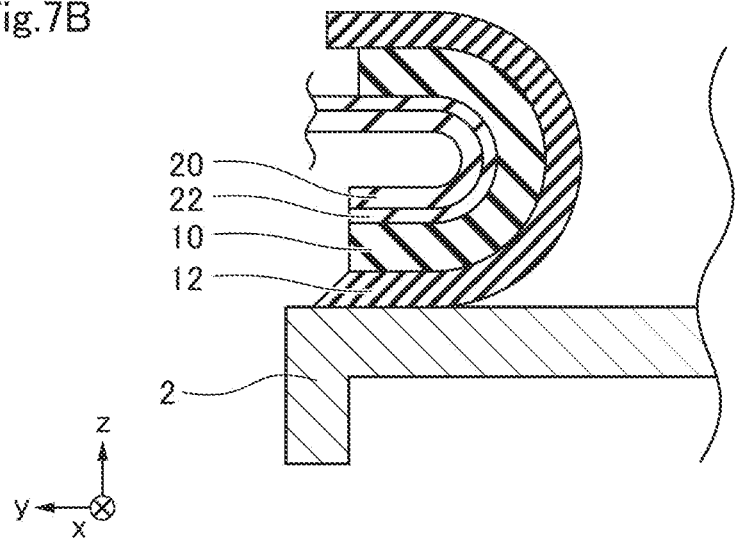

FIGS. 7A-B are schematic cross-sectional views for explaining stresses applied to the first adhesive layer 12 when the protective tape 10 is released using the release tape 20 in the semiconductor manufacturing apparatus according to the comparative embodiment of the present embodiment. In the semiconductor manufacturing apparatus of the comparative embodiment, using the release tape 20, the protective tape 10 is released in Y-direction. In FIGS. 7A-B, the protective tape 10 is released in Y-direction. Near the vicinity of the release starting point shown in the FIG. 7A, since strong bending stresses are not applied to the first adhesive layer 12, it is considered that the first adhesive layer 12 is not brittlely fractured. However, near the vicinity of the release end point shown in FIG. 7B, it is considered that strong bending stresses are applied to the first adhesive layer 12, and the first adhesive layer 12 is brittlely fractured. The remaining first adhesive layer 12 may contaminate other semiconductor manufacturing apparatus used in a later process, or may adversely affect the characteristics of the semiconductor devices formed in the substrate 2.

Figure 8:
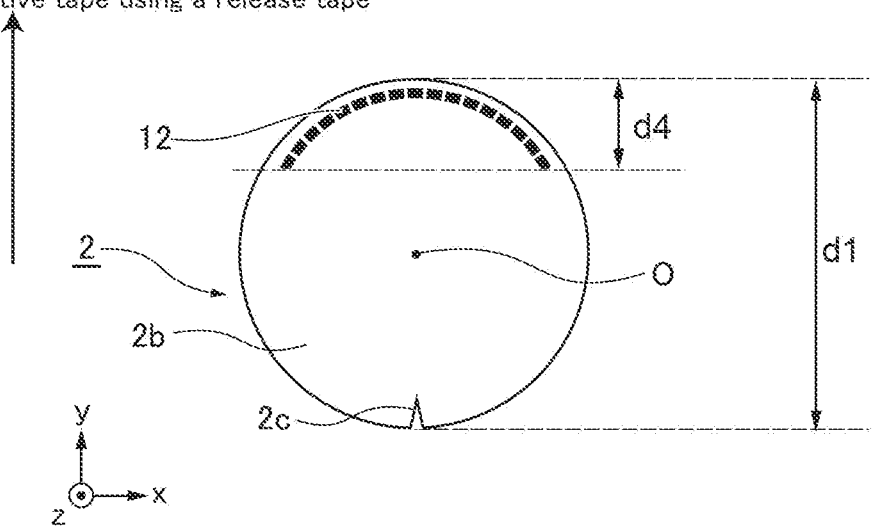
FIG. 8 is a diagram schematically showing the first adhesive layer remaining on a second substrate surface when the protective tape is released using the semiconductor manufacturing apparatus of the comparative embodiment of the first embodiment.

FIG. 8 is a diagram schematically showing the first adhesive layer 12 remaining on the second substrate surface 2b when, the protective tape 10 is released using the semiconductor manufacturing apparatus according to the comparative embodiment of the present embodiment. As described above, near the release end point of the protective tape 10, the first adhesive layer 12 remains. Here, in the direction parallel to the release direction of the protective tape 10, the length $d_4$ of the portion where the first adhesive layer 12 remains is about 30% of the diameter $d_1$ of the substrate 2.

The residual quantity of the first adhesive layer 12 was particularly high when the protective tape 10 having a diameter smaller than the diameter $d_1$ of the substrate 2 was pasted.

In order to remove such residual first adhesive layer 12, it is conceivable to carry out cleaning of the substrate 2 using, for example, an organic solvent. However, there has been a problem in that the number of manufacturing steps increases, and the cost of the semiconductor device increases.

Therefore, the semiconductor manufacturing apparatus of the present embodiment includes a first roller performing a first release of a release tape while performing a first movement in a direction parallel to the second substrate surface from on the first end toward above a center or its vicinity of the second substrate surface, and a second roller performing a second release of the release tape while performing a second movement in a direction parallel to the second substrate surface from on the second end toward above the center or its vicinity of the second substrate surface.

The first release is performed while performing the first movement of the first release roller 40, and the second release is performed while performing the second movement of the second release roller 60 in the opposite direction of the first movement. Thus, the form of the folding back of the release tape 20 by the first release roller 40 and the second release roller 60 can be kept as constant as possible. Therefore, the first adhesive layer 12 can be prevented from being strongly stressed at and near the part where the release of the protective tape 10 is completed. As a result, the residual of the first adhesive layer 12 on the second substrate surface 2b is suppressed. Thus, the adverse effect on the characteristics of the semiconductor device to be formed is suppressed. Therefore, it is possible to provide a semiconductor device of high performance.

It is preferable that the step of performing the first release and the step of performing the second release are performed simultaneously. Further, it is preferable that a first distance of the first movement and a second distance of the second movement are equal. The substrate 2 is fixed to the stage 4 by vacuum-suction or the like. Here, when the step of performing the first release and the step of performing the second release are performed simultaneously, the force applied to the substrate 2 by the first release and the force applied to substrate 2 by the second release cancel each other. Therefore, the substrate 2 is unlikely to deviate from the stage 4. However, when the first release and the second release are not performed simultaneously, the force applied to the substrate 2 by the first release and the force applied to the substrate 2 by the second release do not cancel each other, so that the substrate 2 easily deviates from the stage 4. When the first distance of the first movement and the second distance of the second movement is not equal, substrate 2 is likely to deviate from the stage 4.

According to the semiconductor manufacturing apparatus of the present embodiment, it is possible to provide a semiconductor manufacturing apparatus capable of producing a semiconductor device of high performance. According to the method for manufacturing a semiconductor device of the present embodiment, it is possible to provide a manufacturing method capable of manufacturing a high-performance semiconductor device.

Second Embodiment

A semiconductor manufacturing apparatus according to the present embodiment includes a roller performing a release of a release tape, the release tape having a strip-like configuration, the release tape pasted on a protective tape pasted on a first substrate edge of a second substrate surface of a substrate, the substrate having a first substrate surface and the second substrate surface facing the first substrate surface, the second substrate surface being provided above the first substrate surface, and the roller performing a first movement in a direction parallel to the second substrate surface from on the first end toward above a center or its vicinity of the second substrate surface; a cutter cutting the release tape; and a rotor rotating the substrate in a plane parallel to the second substrate surface.

A method of manufacturing a semiconductor device according to the present embodiment includes a step of pasting a first release tape on a protective tape on a first substrate edge of a second substrate surface, the first release tape having a strip-like configuration, the first release tape having a width shorter than a diameter of the substrate, the protective tape being pasted on the second substrate surface of a substrate, the substrate having a first substrate surface and the second substrate surface facing the first substrate surface and the second substrate surface being provided above the first substrate surface; a step of releasing the protective tape from the second substrate surface by performing a first release of the first release tape while moving a roller from above the first substrate edge toward above the center or its vicinity of the second substrate surface; a step of cutting the first release tape to form a remainder of the first release tape on the protective tape; a step of rotating the substrate in a plane parallel to the second substrate surface; a step of pasting a second release tape on the protective tape on a second substrate edge of the second substrate surface, the second release tape having a strip-like configuration, the second release tape having a width shorter than a diameter of the substrate; and a step of releasing the protective tape from the second substrate surface by performing a second release of the second release tape while moving the roller from above the second substrate edge toward above the center or its vicinity of the second substrate surface.

Here, description of the same content as that of the first embodiment is omitted.

Figure 9:
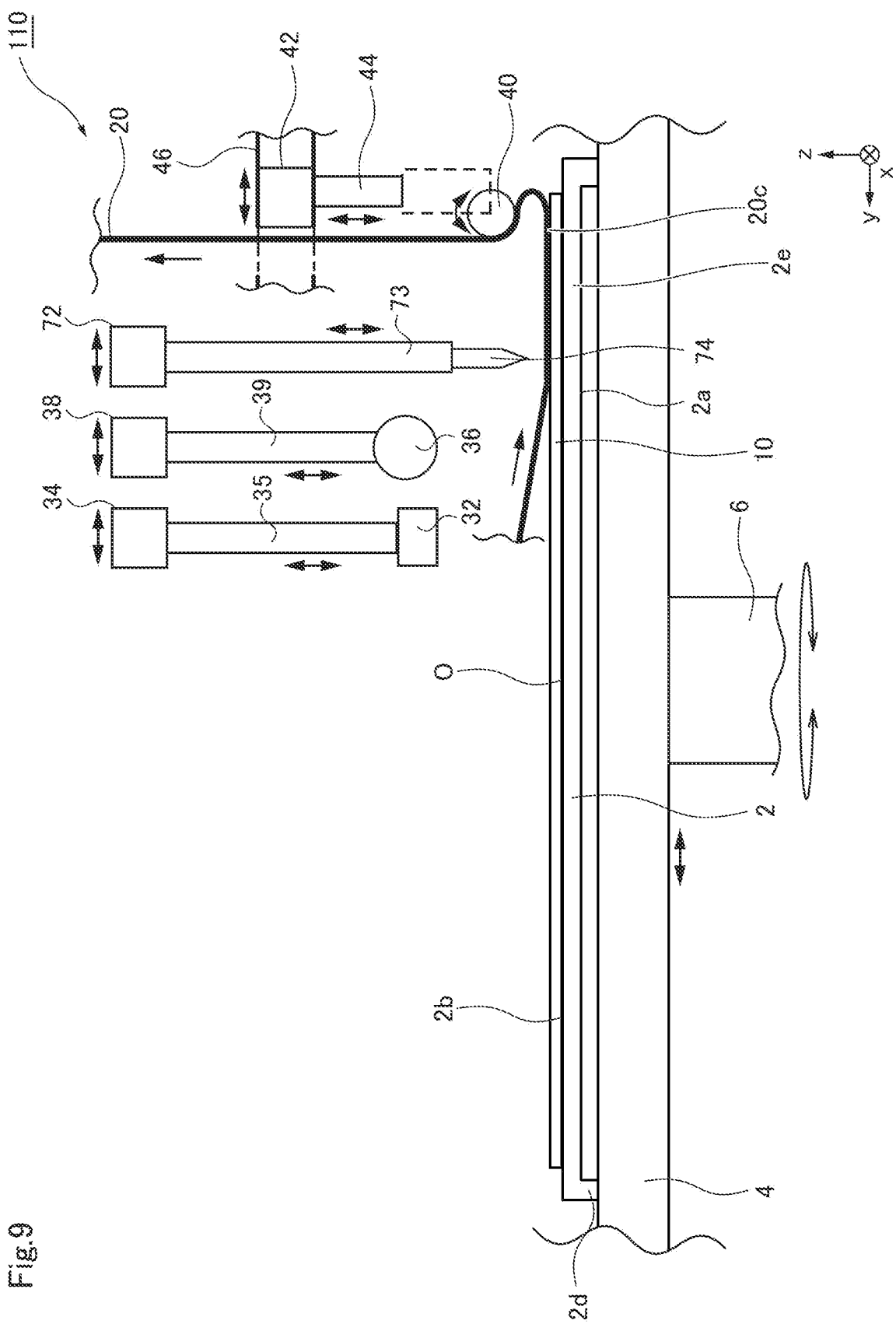
FIG. 9 is a schematic diagram of a semiconductor manufacturing apparatus according to the second embodiment.

FIG. 9 is a schematic diagram of the semiconductor manufacturing apparatus 110 of the present embodiment.

The stage 4 has a rotating mechanism (an example of a rotor) 6 for rotating in a plane parallel to the XY plane. The rotating mechanism 6 is, for example, a motor. Thus, the substrate 2 is rotatable in a plane parallel to the second substrate surface 2b.

A cutting mechanism (an example of a cutter) 74 is provided for cutting the release tape 20. The cutting mechanism 74 is, for example, a tape cutter. Incidentally, the cutting mechanism 74, for example, is movable in the vertical direction and Y direction by a cylinder 73 connected to the cutting mechanism 74, and a slider 72 connected to the cylinder 73.

In the semiconductor manufacturing apparatus 110, for example, the second heater 52, the slider 54, the cylinder 55, the second paste roller 56, the slider 58, the cylinder 59, the second release roller 60, the slider 62 and the cylinder 64 may not be provided.

Figure 10:
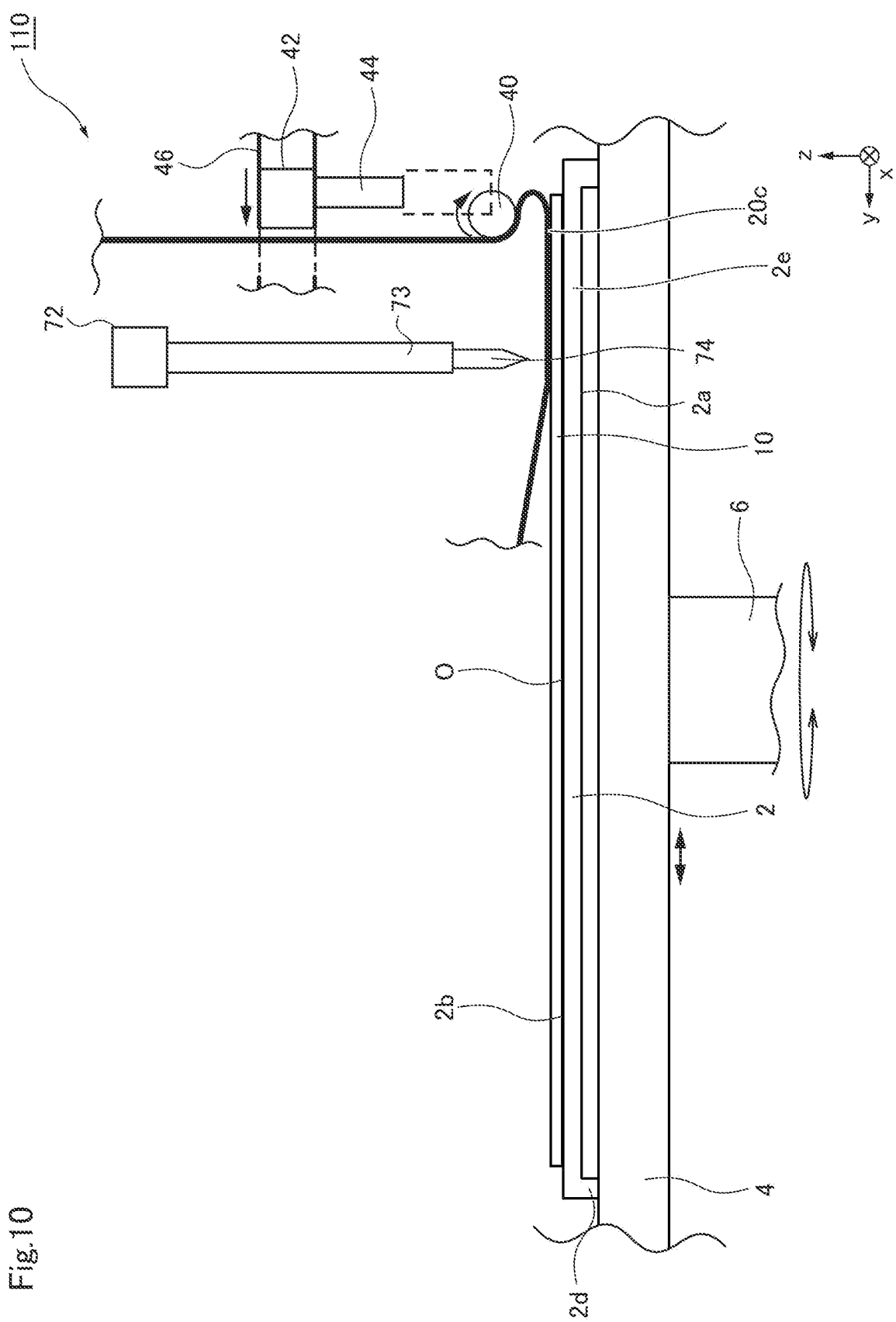
FIG. 10 is a schematic diagram for explaining the method of manufacturing the semiconductor device of the second embodiment.
Figure 11:
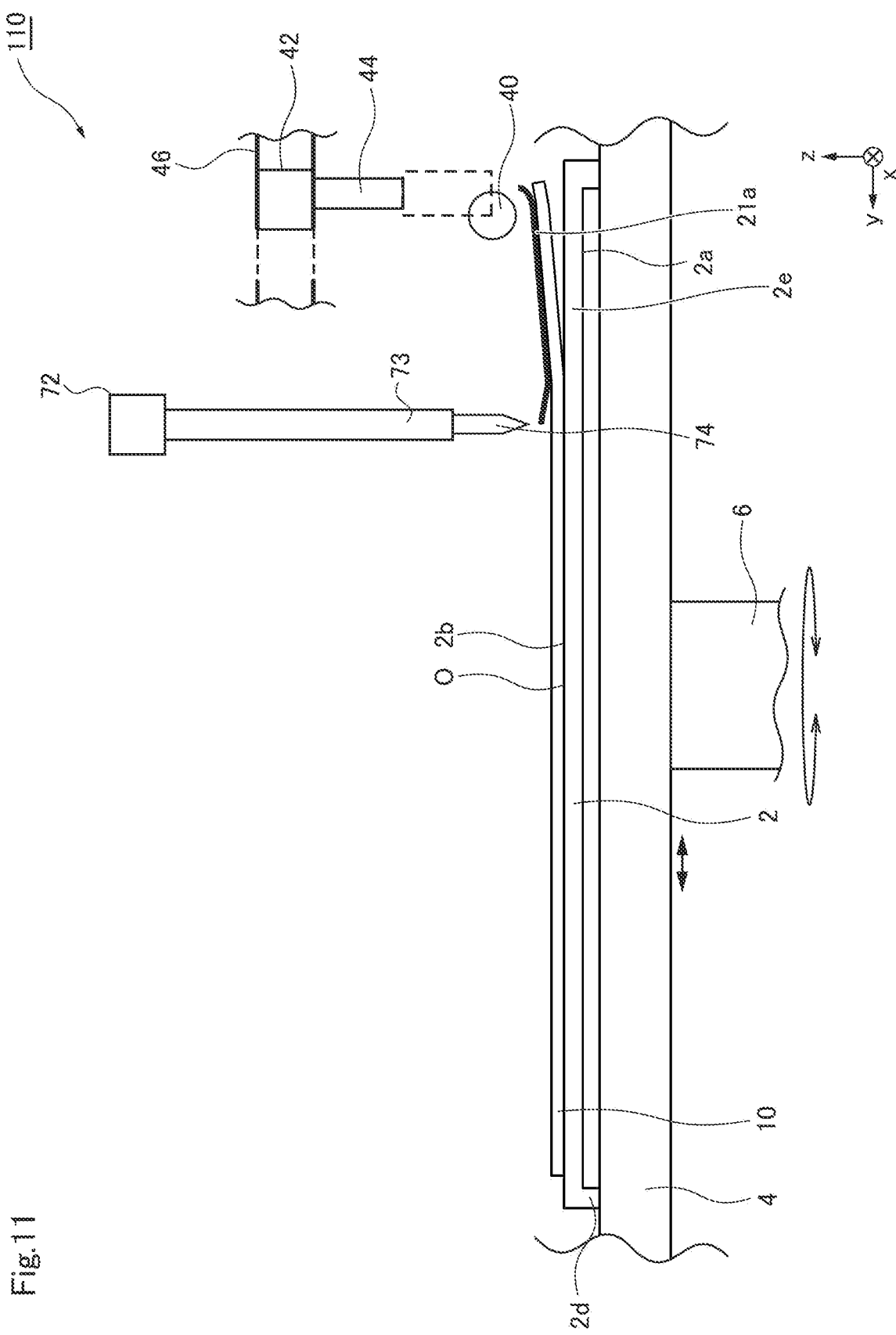
FIG. 11 is a schematic diagram for explaining the method of manufacturing the semiconductor device of the second embodiment.
Figure 12:
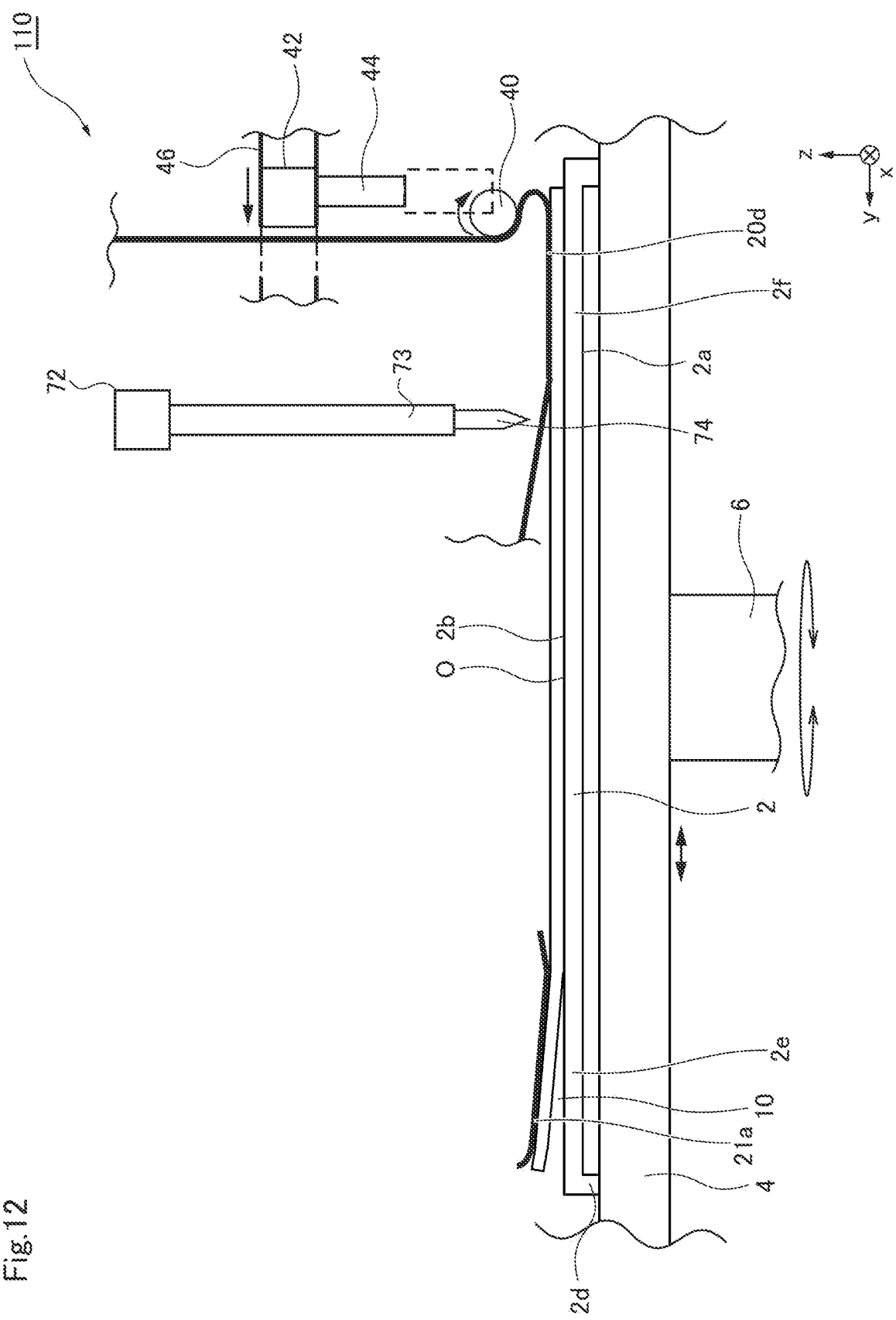
FIG. 12 is a schematic diagram for explaining the method of manufacturing the semiconductor device of the second embodiment.

FIGS. 10 to 12 are schematic diagrams for explaining the method of manufacturing the semiconductor device of the present embodiment. Incidentally, illustration of the first heater 32, the slider 34, the cylinder 35, the first paste roller 36, the slider 38, and the cylinder 39 is omitted.

First, using the first paste roller 36, the first release tape 20c is pressed on the protective tape 10 on the first substrate edge 2e of the second substrate surface 2b, and pasted. Next, using the first heater 32, the first release tape 20c is heated.

Next, using the slider 42, the first movement of the first release roller (an example of the first roller) 40 is performed in the Y-direction parallel to the second substrate surface 2b from above the first substrate edge 2e toward above the center O or its vicinity of the second substrate surface 2b. Thus, the first release of the first release tape 20c is performed (FIG. 10).

By the first release, the protective tape 10 on the first substrate edge 2e is released from the substrate 2. Next, a portion of the first release tape 20c is cut using the cutting mechanism 74. As a result, a remainder of the first release tape 21a is formed from a part of the first release tape 20c on the protective tape 10 on the first substrate edge 2e (FIG. 11).

Next, using the rotating mechanism 6 of the stage 4, the substrate 2 is rotated, for example, by 180 degrees, in the horizontal plane (in a plane parallel to the first substrate surface 2a and the second substrate surface 2b).

Next, using the first paste roller 36, the second release tape 20d is pressed on the protective tape 10 on a second substrate edge 2f of the second substrate surface 2b, and pasted. Next, using first, heater 32, the second release tape 20d is heated.

Next, using the slider 42, the second movement of the first release roller 40 is performed in the Y-direction parallel to the second substrate surface 2b from above the second substrate edge 2f toward above the center O or its vicinity of the second substrate surface 2b. As a result, the second release of the second release tape 20d is performed. As a result, the entire protective tape 10 is released from the substrate 2 (FIG. 12).

Figure 13:
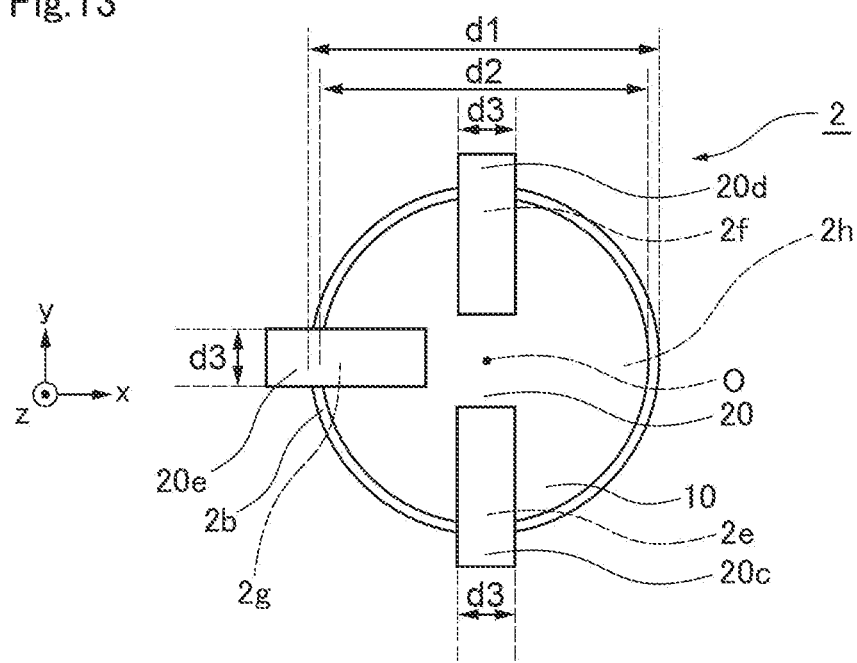
FIG. 13 is a schematic diagram for explaining the method of manufacturing the semiconductor device of the second embodiment.

FIG. 13 is a schematic diagram for explaining the method of manufacturing the semiconductor device of the present embodiment. FIG. 13 is a diagram schematically showing a position to which the second release tape 20d is attached.

In FIGS. 10 to 12, it has been described by referring to the case of rotating the substrate 2 by 180 degrees in the horizontal plane (in a plane parallel to first substrate surface 2a and second substrate surface 2b). In this case, the first substrate edge 2e and the second substrate edge 2f are provided to face each other across the center O of the second substrate surface 2b. Therefore, the first release tape 20c and the second release tape 20d are provided so as to face each other, with the center O of the second substrate surface 2b interposed therebetween.

However, for example, as in a substrate edge 2a, a release tape 20e may be pasted in the vicinity of a portion provided at a position where the substrate 2 is rotated by 90 degrees from the first substrate edge 2e.

However, it is preferable that a position where the second release tape 20d is pasted is opposed to a position where the first release tape 21a is pasted, with the center O of the second substrate surface 2b interposed therebetween. For example, it is considered that after a part of the protective tape 10 is released by pasting the release tape 20c above the substrate edge 2e, a part of the protective tape 10 is released by pasting the release tape 20e above the substrate edge 2g. In this instance, for example, it is considered that the first adhesive layer 12 remains in the vicinity of a substrate edge 2h provided facing the substrate edge 2g, with the center O of the second substrate surface 2b interposed therebetween. In order to suppress this, it is considered that the release tape 20 is pasted to the vicinity of substrate edge 2h to release the protective tape 10. In other words, it is considered that protective tape 10 is released using three pieces of the release tape 20, namely, the release tape 20c, the release tape 20e, and the release tape 20 in the vicinity of the substrate edge 2h. However, in this way, a place where the release tape 20 is pasted is increased, and the number of steps for releasing the protective tape 10 is increased.

On the other hand, when the second release tape 20d is pasted to a position to face a position where the first release tape 20c is pasted, with the center O of the second substrate surface 2b interposed therebetween, the entire protective tape 10 can be released while suppressing the residual of the first adhesive layer 12.

It is preferable that the protective tape 10 is released from the second substrate surface 2b by 30% or more of the diameter $d_1$ of the substrate 2 by the first release and the second release. When the protective tape 10 is released in one direction, the length $d_4$ of the portion where the first adhesive layer 12 remains near the release end point in the direction parallel to the release direction of the protective tape 10 is about 30% of diameter $d_1$ of the substrate 2. This point is illustrated in FIG. 8.

Therefore, in the first release and the second release, the protective tape 10 is released by at least 30% or more of $d_3$ of the substrate 2. This ensures that the protective tape 10 is released by at least 30% or more of $d_1$ of the substrate 2 near the release starting point.

As a result, in the subsequent release, the protective tape 10 has already been released at a distance of about 30% of the diameter $d_1$ of the substrate 2 in the vicinity of the release end point, so that it is possible to prevent the first adhesive layer 12 from being strongly stressed. Therefore, it is possible to suppress the residue of first adhesive layer 12

According to the semiconductor manufacturing apparatus of the present embodiment, it is possible to provide a semiconductor manufacturing apparatus capable of producing a semiconductor device of high performance. According to the method for manufacturing a semiconductor device of the present embodiment, it is possible to provide a manufacturing method capable of manufacturing a high-performance semiconductor device.

While certain embodiments have been described, these embodiments have been presented by way of example only, and are not intended to limit the scope of the inventions. Indeed, the semiconductor manufacturing apparatus and the method of manufacturing the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
   a step of performing a first release of a release tape by a first roller, the release tape having a strip-like configuration and having a first end and a second end, the release tape pasted on a protective tape pasted on a second substrate surface of a substrate, the substrate having a first substrate surface and the second substrate surface facing the first substrate surface, the second substrate surface being provided above the first substrate surface, and the first roller performing a first movement in a direction parallel to the second substrate surface from on the first end toward above a center or its vicinity of the second substrate surface; and
   a step of performing a second release of the release tape by a second roller, the second roller performing a second movement in a direction parallel to the second substrate surface from on the second end toward above the center or its vicinity of the second substrate surface.

2. The method of manufacturing a semiconductor device according to claim 1,
   wherein the step of performing the first release and the step of performing the second release are performed simultaneously.

3. The method of manufacturing a semiconductor device according to claim 1,
   wherein the protective tape is released from the second substrate surface by the first release and the second release.

4. The method of manufacturing a semiconductor device according to claim 1,
   wherein the diameter of the protective tape is shorter than the diameter of the substrate.

5. The method of manufacturing a semiconductor device according to claim 1,
   wherein the step of performing the first release and the step of performing the second release are performed simultaneously, and
   wherein the protective tape is released from the second substrate surface by the first release and the second release.

6. The method of manufacturing a semiconductor device according to claim 1,
   wherein the step of performing the first release and the step of performing the second release are performed simultaneously,
   wherein the protective tape is released from the second substrate surface by the first release and the second release, and
   wherein the diameter of the protective tape is shorter than the diameter of the substrate.

7. The method of manufacturing a semiconductor device according to claim 1,
   wherein the protective tape is released from the second substrate surface by the first release and the second release, and
   wherein the diameter of the protective tape is shorter than the diameter of the substrate.

8. The method of manufacturing a semiconductor device according to claim 1,
   wherein a first distance of the first movement and a second distance of the second movement are equal.

9. The method of manufacturing a semiconductor device according to claim 1,
   wherein a first distance of the first movement is equal to a first release amount of the first release of the release tape, and
   wherein a second distance of the second movement is equal to a second release amount of the second release of the release tape.

10. A method of manufacturing a semiconductor device, comprising:
    a step of pasting a first release tape on a protective tape on a first substrate edge of a second substrate surface, the first release tape having a strip-like configuration, the first release tape having a width shorter than a diameter of the substrate, the protective tape being pasted on the second substrate surface of a substrate, the substrate having a first substrate surface and the second substrate surface facing the first substrate surface and the second substrate surface being Provided above the first substrate surface;
    a step of releasing the protective tape from the second substrate surface by performing a first release of the first release tape while moving a roller from above the first substrate edge toward above the center or its vicinity of the second substrate surface;
    a step of cutting the first release tape to form a remainder of the first release tape on the protective tape;
    a step of rotating the substrate in a plane parallel to the second substrate surface;
    a step of pasting a second release tape on the protective tape on a second substrate edge of the second substrate surface, the second release tape having a strip-like configuration, the second release tape having a width shorter than a diameter of the substrate; and
    a step of releasing the protective tape from the second substrate surface by performing a second release of the second release tape while moving the roller from above the second substrate edge toward above the center or its vicinity of the second substrate surface.

11. The method of manufacturing a semiconductor device according to claim 10,
    wherein the diameter of the protective tape is shorter than the diameter of the substrate.

12. The method of manufacturing a semiconductor device according to claim 10,
   wherein, a position where the second release tape is pasted is opposed to a position where the first release tape is pasted, with the center of the second substrate surface interposed therebetween.

13. The method of manufacturing a semiconductor device according to claim 10,
   wherein, in the first release and the second release, the protective tape is released by at least 30% or more of the diameter of the substrate from the second substrate surface.

14. The method of manufacturing a semiconductor device according to claim 10,
   wherein the diameter of the protective tape is shorter than the diameter of the substrate, and
   wherein, a position where the second release tape is pasted is opposed to a position where the first release tape is pasted, with the center O of the second substrate surface interposed therebetween.

15. The method of manufacturing a semiconductor device according to claim 10,
   wherein the diameter of the protective tape is shorter than the diameter of the substrate, and
   wherein, a position where the second release tape is pasted is opposed to a position where the first release tape is pasted, with the center of the second substrate surface interposed therebetween, and
   wherein, in the first release and the second release, the protective tape is released by at least 30% or more of the diameter of the substrate from the second substrate surface.

16. The method of manufacturing a semiconductor device according to claim 10,
   wherein, a position where the second release tape is pasted is opposed to a position where the first release tape is pasted, with the center of the second substrate surface interposed therebetween, and
   wherein, in the first release and the second release, the protective tape is released by at least 30% or more of the diameter of the substrate from the second substrate surface.

* * * * *